United States Patent
Koide

(10) Patent No.: US 7,123,502 B2
(45) Date of Patent: Oct. 17, 2006

(54) STORAGE CIRCUIT, SEMICONDUCTOR DEVICE, AND ELECTRONIC APPARATUS

(75) Inventor: Yasunori Koide, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 9 days.

(21) Appl. No.: 11/020,142

(22) Filed: Dec. 27, 2004

(65) Prior Publication Data

US 2005/0146914 A1 Jul. 7, 2005

(30) Foreign Application Priority Data

Dec. 24, 2003 (JP) ............... 2003-427713

(51) Int. Cl.
*G11C 11/22* (2006.01)

(52) U.S. Cl. ............ 365/145; 365/149; 365/154; 365/185.08

(58) Field of Classification Search ............ None
See application file for complete search history.

(56) References Cited

U.S. PATENT DOCUMENTS

| | | | |
|---|---|---|---|
| 4,809,225 A * | 2/1989 | Dimmler et al. | 365/149 |
| 6,285,575 B1 * | 9/2001 | Miwa | 365/145 |
| 6,646,909 B1 * | 11/2003 | Miwa et al. | 365/154 |
| 6,738,281 B1 | 5/2004 | Yokozeki | |
| 6,836,428 B1 * | 12/2004 | Nakura et al. | 365/154 |
| 6,934,178 B1 * | 8/2005 | Yokozeki et al. | 365/145 |
| 2005/0135142 A1 * | 6/2005 | Koide | 365/145 |

FOREIGN PATENT DOCUMENTS

| | | |
|---|---|---|
| JP | 64-066899 A | 3/1989 |
| JP | A 8-264728 | 10/1996 |
| JP | A 10-83679 | 3/1998 |
| JP | A 2001-307477 | 11/2001 |
| JP | A 2001-344962 | 12/2001 |
| JP | A 2002-150765 | 5/2002 |
| JP | A 2002-157879 | 5/2002 |
| KR | 2003-0057294 | 7/2003 |

* cited by examiner

*Primary Examiner*—Tan T. Nguyen
(74) *Attorney, Agent, or Firm*—Oliff & Berridge, PLC

(57) ABSTRACT

To provide a storage circuit that can readily and stably read memory data, in storage circuits that are used mainly in program circuits. A storage circuit that is equipped with a flip-flop having a first terminal and a second terminal, a storage section having a first ferroelectric capacitor and a second ferroelectric capacitor for storing specified data, a control section that supplies a driving voltage to the flip-flop, and controls potentials on the first terminal and the second terminal based on the specified data, thereby retaining the specified data at the flip-flop, and a latch circuit that latches the specified data retained by the flip-flop based on potentials on the first terminal and the second terminal.

11 Claims, 6 Drawing Sheets

STORAGE CIRCUIT, SEMICONDUCTOR DEVICE, AND ELECTRONIC APPARATUS

BACKGROUND

The present invention relates to storage circuits, semiconductor devices, and electronic apparatuses. In particular, the present invention relates to storage circuits with a simple structure and whose operation is stable, semiconductor devices and electronic apparatuses equipped with the storage circuits.

A conventional memory cell is disclosed in Japanese Laid-open Patent Application 64-66899 (Patent Document 1). The memory cell disclosed in the aforementioned Patent Document 1 is equipped with a static cell having two internal nodes, and a nonvolatile section having two ferroelectric capacitors. Then, by applying a voltage to the ferroelectric capacitors to the extent that the ferroelectric capacitors causes polarity inversion, a voltage on one of the internal nodes rises slightly higher than a voltage on the other of the internal nodes. By this, data is transferred from the nonvolatile section to the static cell. Japanese Laid-open Patent Application SHO 64-66899.

SUMMARY

However, in the conventional memory cell described in the aforementioned Patent Document 1, for transferring data from the nonvolatile section to the static cell, it is necessary to pre-charge the bit line and further to apply the voltage to the ferroelectric capacitors. This causes a problem in that its operation becomes complex. Also, in the conventional memory cell described in the aforementioned Patent Document 1, although the voltage on one of the internal nodes becomes higher than the voltage on the other of the internal nodes, their difference is small. Therefore, there is a problem in that, if there are manufacturing variations in the threshold voltage of transistors composing the static cell, the static cell may malfunction.

Accordingly, it is an object of the present invention to provide storage circuits, semiconductor devices, and electronic apparatuses, which can solve the problems described above. This object can be achieved by combining the characteristics set forth in the independent claims in the scope of patent claims. Also, the dependent claims further define advantageous concrete examples of the present invention.

To achieve the aforementioned object, in accordance with a first embodiment of the present invention, there is provided a storage circuit characterized in comprising: a flip-flop having a first terminal and a second terminal; a storage section having a first ferroelectric capacitor and a second ferroelectric capacitor for storing specified data; a control section that supplies a driving voltage to the flip-flop, and controls potentials on the first terminal and the second terminal based on the specified data, thereby retaining the specified data at the flip-flop; and a latch circuit that latches the specified data retained by the flip-flop based on potentials on the first terminal and the second terminal. In this case, the control section may preferably stop supplying the driving voltage to the flip-flop after the latch circuit has latched the specified data.

With the structure described above, memory data stored in the first ferroelectric capacitor and the second ferroelectric capacitor is latched at the latch circuit. In other words, even when the operation of the flip-flop is stopped, the memory data is latched at the latch circuit. Accordingly, with the structure described above, the operation of the flip-flop can be stopped, such that the voltage that applied to the first ferroelectric capacitor and the second ferroelectric capacitor can be reduced. Accordingly, with the structure described above, deterioration of the first ferroelectric capacitor and the second ferroelectric capacitor can be suppressed.

Supplying a driving voltage to the flip-flop includes turning power on the storage circuit or a device that is equipped with the storage circuit, changing the logical value of a signal that is supplied to power supply terminals of the inverters composing the flip-flop, and the like. Also, when the flip-flop is composed of clocked inverters, changing the logical value of a signal to be supplied to control terminals of the clocked inverters is also included.

Also, the first ferroelectric capacitor may preferably give a first capacity to the first terminal, and the second ferroelectric capacitor may preferably give a second capacity different from the first capacity to the second terminal, and the flip-flop may preferably retain the specified data based on the first capacity and the second capacity.

With the structure described above, when a driving voltage is supplied to the flip-flop, potentials on the first terminal and the second terminal elevate according to the first capacity and the second capacity, respectively. In other words, the potentials on the first terminal and the second terminal elevate according to the capacities based on paraelectric characteristics of the first ferroelectric capacitor and the second ferroelectric capacitor, respectively. Accordingly, memory data to be retained by the flip-flop is set according to the first capacity and the second capacity. Accordingly, by the structure described above, there can be provided a storage circuit that can readily store memory data by setting the first capacity and the second capacity, and that can readily read the memory data with a very simple structure.

The storage circuit may preferably be further equipped with a discharge section that brings both ends of the first ferroelectric capacitor and the second ferroelectric capacitor to generally the same potential. With the structure described above, the voltage that is to be applied to the first ferroelectric capacitor and the second ferroelectric capacitor can be brought to about 0V. Accordingly, deterioration of the first ferroelectric capacitor and the second ferroelectric capacitor can be further suppressed.

Also, the discharge section may preferably control, based on a timing at which the control section starts or stops supplying the driving voltage to the flip-flop, as to whether or not the both ends of the first ferroelectric capacitor and the second ferroelectric capacitor are to be brought to generally the same potential. With the structure described above, for example, when the flip-flop is operating, the both ends of the first ferroelectric capacitor and the second ferroelectric capacitor can be opened, and when the flip-flop stops its operation, the first ferroelectric capacitor and the second ferroelectric capacitor can be discharged. Accordingly, with the structure described above, the first ferroelectric capacitor and the second ferroelectric capacitor can be effectively discharged.

The control section may preferably re-supply the driving voltage to the flip-flop, thereby re-retaining the specified data retained by the latch circuit in the flip-flop. With the structure described above, even when the operation of the flip-flop is stopped after the memory data has been latched at the latch circuit, the memory data can be rewritten in the flip-flop. Accordingly, with the structure described above, memory data can be written again in the first ferroelectric capacitor and the second ferroelectric capacitor.

A switch that controls as to whether or not the first terminal or the second terminal is electrically connected to the latch circuit may preferably be further provided. With the structure described above, only when data retained at the flip-flop is to be latched at the latch circuit, or only when data latched at the latch circuit is to be written in the flip-flop, the flip-flop and the latch circuit can be electrically connected. Accordingly, malfunctions of the program circuit can be prevented.

Also, preferably, the flip-flop may retain the specified data by placing the second terminal to a first potential or a second potential higher than the first potential, and the latch circuit may have an input terminal that is electrically connected to the switch, wherein, when the switch electrically connects the flip-flop and the input terminal, a potential on the input terminal becomes to be generally the same potential as the second potential.

With the structure described above, for example, when the flip-flop and the latch circuit are electrically connected in order to latch memory data retained at the flip-flop onto the latch circuit, the potential on the input terminal becomes to be a potential that is generally the same potential as or a higher potential than the potential on the second terminal. Accordingly, with the structure described above, when the flip-flop and the latch circuit are electrically connected, memory data retained at the flip-flop is prevented from changing due to the potential on the input terminal.

The storage circuit may preferably be further equipped with a short-circuit section that controls as to whether or not the first terminal and the second terminal are to be electrically connected. With the structure described above, the first terminal and the second terminal can be generally at the same potential. Accordingly, the flip-flop can be further stably operated.

In accordance with a second embodiment of the present invention, there is provided a semiconductor device characterized in comprising the storage circuit described above. It is noted here that the semiconductor device generally refers to a device composed of semiconductor, which is quipped with a storage circuit in accordance with the present invention, and is not particularly limited in its structure, but may include a variety of devices that require storage devices, such as, for example, ferroelectric memory devices, DRAMs, flash memories and the like, which are equipped with the storage circuit described above.

In accordance with a third embodiment, there is provided an electronic apparatus characterized in comprising the semiconductor device described above. It is noted here that the electronic apparatus generally refers to an apparatus equipped with a semiconductor device in accordance with the present invention, which achieves predetermined functions, and is not particularly limited in its structure, but may include a variety of devices that require storage devices, such as, for example, computer devices in general, portable telephones, PHSs, PDAs, electronic notebooks, IC cards, and the like, which are equipped with the semiconductor device described above.

DETAILED DESCRIPTION OF EMBODIMENTS

The present invention is described below based on embodiments of the present invention with reference to the accompanying drawings. However, the embodiments described below do not in anyway limit the invention concerning the scope of patent claims, and all the combinations of the characteristics described in the embodiments would not necessarily be indispensable as the means for solution of the invention.

Figure 1:
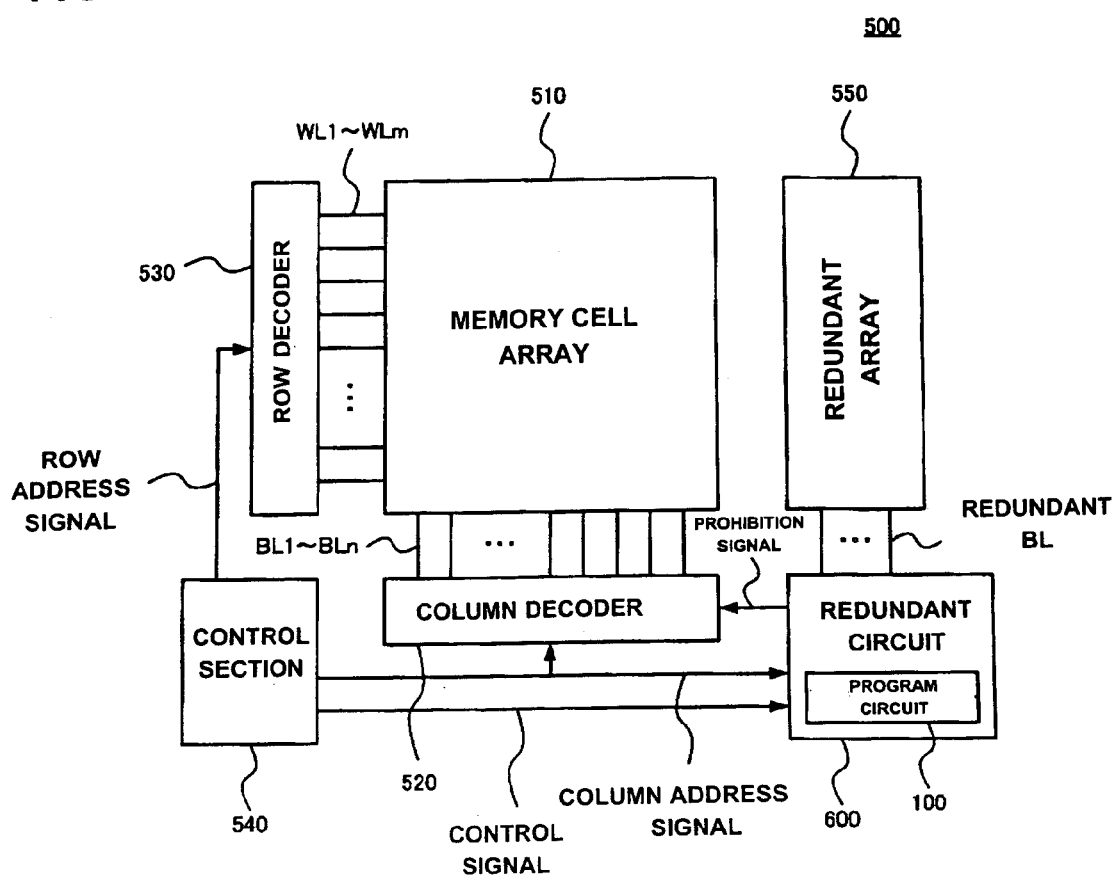
FIG. 1 is a diagram showing a structure of a ferroelectric memory device 500 which is an example of a semiconductor device in accordance with an embodiment of the present invention.

FIG. 1 is a diagram showing a structure of a ferroelectric memory device 500 which is an example of a semiconductor device in accordance with an embodiment of the present invention. The ferroelectric memory device 500 has a structure equipped with a memory cell array 510, a column decoder 520, a row decoder 530, a control section 540, a redundant array 550, and a redundant circuit 600.

The memory cell array 510 has a structure equipped with a plurality of ferroelectric capacitors disposed in an array. Each of the ferroelectric capacitors is controlled by a bit line BL and a word line WL among word lines WL1–WLm (m is an integer of 2 or greater) and bit lines BL1–BLn (n is an integer of 2 or greater), respectively. More specifically, by controlling potentials on the bit line BL and the word line WL, data written in the corresponding ferroelectric capacitor can be read, or data can be written in the corresponding ferroelectric capacitor.

The control section 540 generally controls operations of the ferroelectric memory device 500. More specifically, the control section 540 supplies row address signals and column address signals to the row decoder 530 and the column decoder 520, respectively, to read data from the ferroelectric capacitors, and to write data in the ferroelectric capacitors. Also, the control section 540 supplies control signals to the redundant circuit 600 to control a program circuit 100. Also, the control section 540 generates a driving voltage to drive the ferroelectric memory device 500, and supplies the same to various sections including the program circuit 100.

The row decoder 530 controls potentials on the word lines WL1–WLm. More specifically, the row decoder 530 receives a row address signal from the control section 540, and selects a specified word line WLj (j is an integer of 1 through m), based on the row address signal. Also, the column decoder 520 controls potentials on the bit lines BL1–BLn. More specifically, the column decoder 520 receives a column address signal from the control section 540, and selects a specified bit line BLk (k is an integer of 1 through n), based on the column address signal. By this, one of the ferroelectric capacitors corresponding to the word line WLk selected by the row decoder 530 and the bit line BLk selected by the column decoder 520.

The redundant circuit 600 has a structure having a plurality of program circuits 100, each of which is an example of a storage circuit. The redundant circuit 600 generates, based on an output signal and a column address signal outputted from the program circuit 100, a prohibition signal to prohibit access to a specified bit line BLk specified by the output signal and the column address signal, and supplies the same to the column decoder 520. Also, when the bit line BLk whose access is prohibited is selected, the redundant circuit 600 controls the redundant cell array 550 to select a redundant bit line BL instead of the bit line BLk. In other words, the redundant circuit 600 replaces the bit line BLk whose access is prohibited for a redundant bit line.

Figure 2:
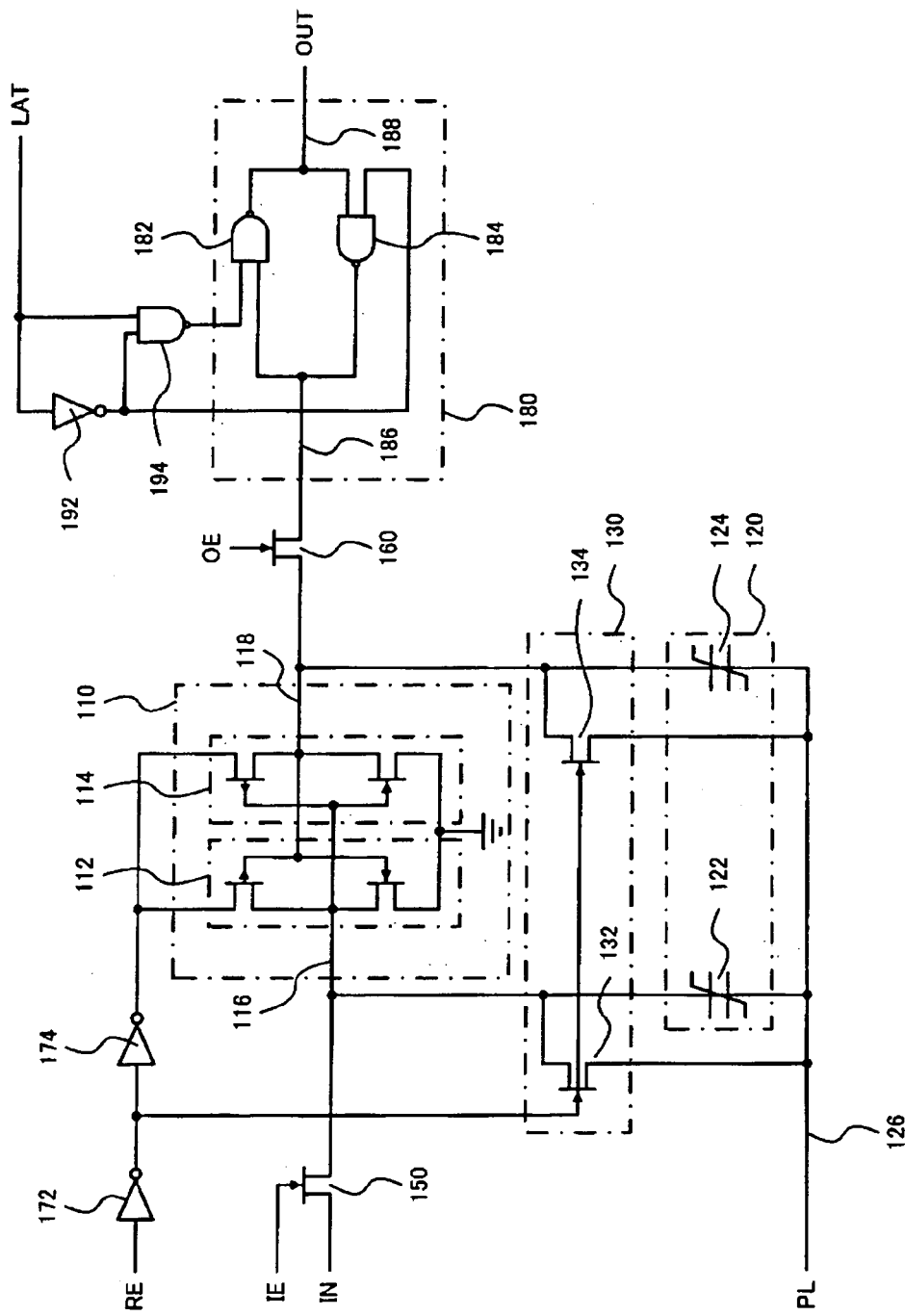
FIG. 2 is a diagram indicating a program circuit 100 in accordance with a first embodiment.

FIG. 2 is a diagram indicating the program circuit 100 in accordance with the first embodiment. The program circuit 100 has a structure equipped with a flip-flop 110, a storage section 120, a discharge section 130, a write section 150, a connecting section 160, and a latch circuit 180. The program circuit 100 is a circuit that reads memory data stored in the storage section 120 that is a nonvolatile storage device, writes the memory data read out in the flip-flop 110, and latches the memory data at the latch circuit 180 to thereby supply the memory data externally as an output signal OUT.

The flip-flop 110 has a structure having a first inverter 112 and a second inverter 114, and a first terminal 116 and a second terminal 118 which electrically connect the flip-flop 110 to an external component. Each of the first inverter 112 and the second inverter 114 has an input terminal and an output terminal, the output terminal of the first inverter 112 is electrically connected to the input terminal of the second inverter 114, and the output terminal of the second inverter 114 is electrically connected to the input terminal of the first inverter 112. Also, the input terminal of the first inverter 112 and the output terminal of the second inverter 114 are electrically connected to the first terminal 116, and the output terminal of the first inverter 112 and the input terminal of the second inverter 114 are electrically connected to the second terminal 118.

More specifically, each of the first inverter 112 and the second inverter 114 is composed of a p-type MOS transistor and an n-type MOS transistor. In the first inverter 112, the p-type MOS transistor has one of its source and drain being supplied with the driving voltage, and the other being electrically connected to one of the source and drain of the n-type MOS transistor. Then, the one of the source and drain of the p-type MOS transistor and the other of the source and the drain of the n-type MOS transistor compose an output terminal of the first inverter 112, and the gates of the p-type MOS transistor and the n-type MOS transistor compose an input terminal of the first inverter 112. Also, the other of the source and the drain of the n-type MOS transistor is grounded.

Also, in the second inverter 114, the p-type MOS transistor similarly has one of its source and drain being supplied with the driving voltage, and the other being electrically connected to one of the source and drain of the n-type MOS transistor. Also, the other of the source and the drain of the n-type MOS transistor is grounded. Then, the one of the source and drain of the p-type MOS transistor and the other of the source and the drain of the n-type MOS transistor compose an output terminal of the second inverter 114, and the gates of the p-type MOS transistor and the n-type MOS transistor compose an input terminal of the second inverter 114.

In the present embodiment, the control section 540 changes the logical value of a control signal RE to be supplied to the flip-flop, thereby supplying the driving voltage to the flip-flop 110 for driving the flip-flop 110. In the present embodiment, when the control signal RE indicates a logical H, the control signal RE has a potential at VCC, and when the control signal RE is a logical L, its potential is 0V. Accordingly, when the control signal RE indicates a logical H, VCC is supplied as a driving voltage to the flip-flop 110, and when the control signal RE changes from the logical H to a logical L, supply of the driving voltage to the flip-flop 110 is stopped.

The storage section 120 has a structure having a first ferroelectric capacitor 122 and a second ferroelectric capacitor 124. Each of the first ferroelectric capacitor 122 and the second ferroelectric capacitor 124 has one end and another end. The one end of the first ferroelectric capacitor 122 is formed to be electrically connectable to the first terminal 116, and the one end of the second ferroelectric capacitor 124 is formed to be electrically connectable to the second terminal 118. Also, the other end of the first ferroelectric capacitor 122 and the other end of the second ferroelectric capacitor 124 are electrically connected to a plate line 126.

Also, the first ferroelectric capacitor 122 and the second ferroelectric capacitor 124 store complementary data, such that the first ferroelectric capacitor 122 and the second ferroelectric capacitor 124 have mutually different capacities based on their paraelectric characteristics. Accordingly, when the flip-flop 110 and the storage section 120 are electrically connected, the first ferroelectric capacitor 122 gives a predetermined capacity to the first terminal 116, and the second ferroelectric capacitor 124 gives a capacity different from the predetermined capacity to the second terminal 118.

The discharge section 130 brings potentials on one ends and the other ends of the first ferroelectric capacitor 122 and the second ferroelectric capacitor 124 to generally the same potential, based on the potential of the control signal RE. In the present embodiment, the discharge section 130 short-circuits the one ends and the other ends of the first ferroelectric capacitor 122 and the second ferroelectric capacitor 124, thereby bringing the potentials on both ends of the first ferroelectric capacitor 112 and the second ferroelectric capacitor 124 to generally the same potential.

More specifically, an n-type MOS transistor 132 composing the discharge section 130 has one of its source and drain electrically connected to one end of the ferroelectric capacitor 122, and the other electrically connected to the other end. Also, an n-type MOS transistor 134 has one of its source and drain electrically connected to one end of the second ferroelectric capacitor 124, and the other electrically connected to the other end. In other words, the n-type MOS transistors 132 and 134 are composed to short-circuit the one ends and the other ends of the first ferroelectric capacitor 122 and the second ferroelectric capacitor 124, respectively, based on the potential of the control signal RE.

Also, the discharge section 130 may preferably bring the both ends of the first ferroelectric capacitor 122 and the second ferroelectric capacitor 124 to generally the same potential, based on a timing at which the control section 54 stops supplying the driving voltage to the flip-flop 110. In the present embodiment, the discharge section 130 controls, based on a change in the logical value of the control signal RE, as to whether or not the both ends of the first ferroelectric capacitor 122 and the second ferroelectric capacitor 124 are to be short-circuited. In other words, the discharge section 130 short-circuits the both ends of the first ferroelectric capacitor 122 and the second ferroelectric capacitor 124, as the supply of the driving voltage to the flip-flop 110 stops, and opens the both ends of the first ferroelectric capacitor 122 and the second ferroelectric capacitor 124, as the supply of the driving voltage to the flip-flop 110 starts.

In another embodiment, the discharge section 130 may bring the potential on one ends of the first ferroelectric capacitor 122 and the second ferroelectric capacitor 124 to generally the same potential as the potential on the plate line 126, thereby bringing the one ends and the other ends of the first ferroelectric capacitor 122 and the second ferroelectric capacitor 124 to generally the same potential. For example, one of the sources and the drains of the n-type MOS transistors 132 and 134 may be electrically connected to one ends of the first ferroelectric capacitor 122 and the second ferroelectric capacitor 124, and the other may be grounded. Then, the control section 540 may bring the n-type MOS transistors 132 and 134 conductive, thereby bringing the potentials on the one ends of the first ferroelectric capacitor 122 and the second ferroelectric capacitor 124 to 0V, and, also brings the potential of the control signal PL to 0V, thereby bringing the voltage to be applied to the first ferroelectric capacitor 122 and the second ferroelectric capacitor 124 to generally 0V.

The writing section 150 writes memory data in the flip-flop 110, based on the potentials of control signals IE and IN. More specifically, the writing section 150 is formed from an n-type MOS transistor having its gate being supplied with the control signal IE, one of its source and drain being electrically connected to the first terminal 116, and the other being supplied with the control signal IN. In other words, the writing section 150 controls, based on the potential of the control signal IE, as to whether or not the control signal IN is to be supplied to the first terminal 116, thereby controlling the potential on the first terminal 116. By this, desired memory data can be written in the flip-flop 110. Also, the writing section 150 may be formed with a transfer gate instead of the n-type MOS transistor.

The connecting section 160 controls, based on the potential of the control signal RE, as to whether or not the flip-flop 110 and the latch circuit 180 are to be electrically connected. More specifically, the connecting section 160 is formed from an n-type MOS transistor having its gate being supplied with a control signal OE, one of its source and drain being electrically connected to the second terminal 118, and the other being electrically connected to the latch circuit 180. Accordingly, when the connecting section 160 electrically connects the flip-flop 110 and the latch circuit 180, the latch circuit 180 latches, based on the potential on the second terminal 118, memory data retained by the flip-flop 110. Also, when the connecting section 160 electrically connects the flip-flop 110 and the latch circuit 180, the latch circuit 180 may control the potential on the second terminal 118, based on the data that is latched by the latch circuit 180, to thereby write the data in the flip-flop 110.

The latch circuit 180 latches, based on the potentials of a control signal LAT and on the second terminal 118, memory data retained by the flip-flop 110. The latch circuit 180 has a structure having NAND circuits 182 and 184, an input terminal 186 and an output terminal 188. Also, an inverter 192 supplies an inversion signal that is the inverted control signal LAT to the latch circuit 180 and an input terminal of the NAND circuit 194. The NAND circuit 194 receives the control signal LAT and its inversion signal as inputs, and supplies a negative logical product of the control signal LAT and its inversion signal to the latch circuit 180.

The NAND circuit 182 receives the negative logical product of the control signal LAT and the inversion signal of the control signal LAT, and the logical value on the input terminal 186 as an input, and outputs a negative logical product of the negative logical product and the logical value. The NAND circuit 184 receives the inversion signal of the control signal LAT and an output of the NAND circuit 182 as an input, and supplies a negative logical product of the control signal LAT and the output to the input terminal 186. Also, the input terminal 186 is electrically connected to the connection section 160, and the output terminal 188 outputs the potential of the output of the NAND circuit 182 as an output signal OUT outside of the latch circuit 180.

The latch circuit 180 may preferably be provided such that, when the connection section 160 electrically connects the second terminal 118 and the input terminal 186, the logical value on the input terminal 186 is a logical H, in other words, the potential on the input terminal 186 is VCC. For example, the latch circuit 180 is provided such that, when supply of the driving voltage to the latch circuit 180 is started, the logical value on the input terminal 186 is a logical H.

Figure 3:
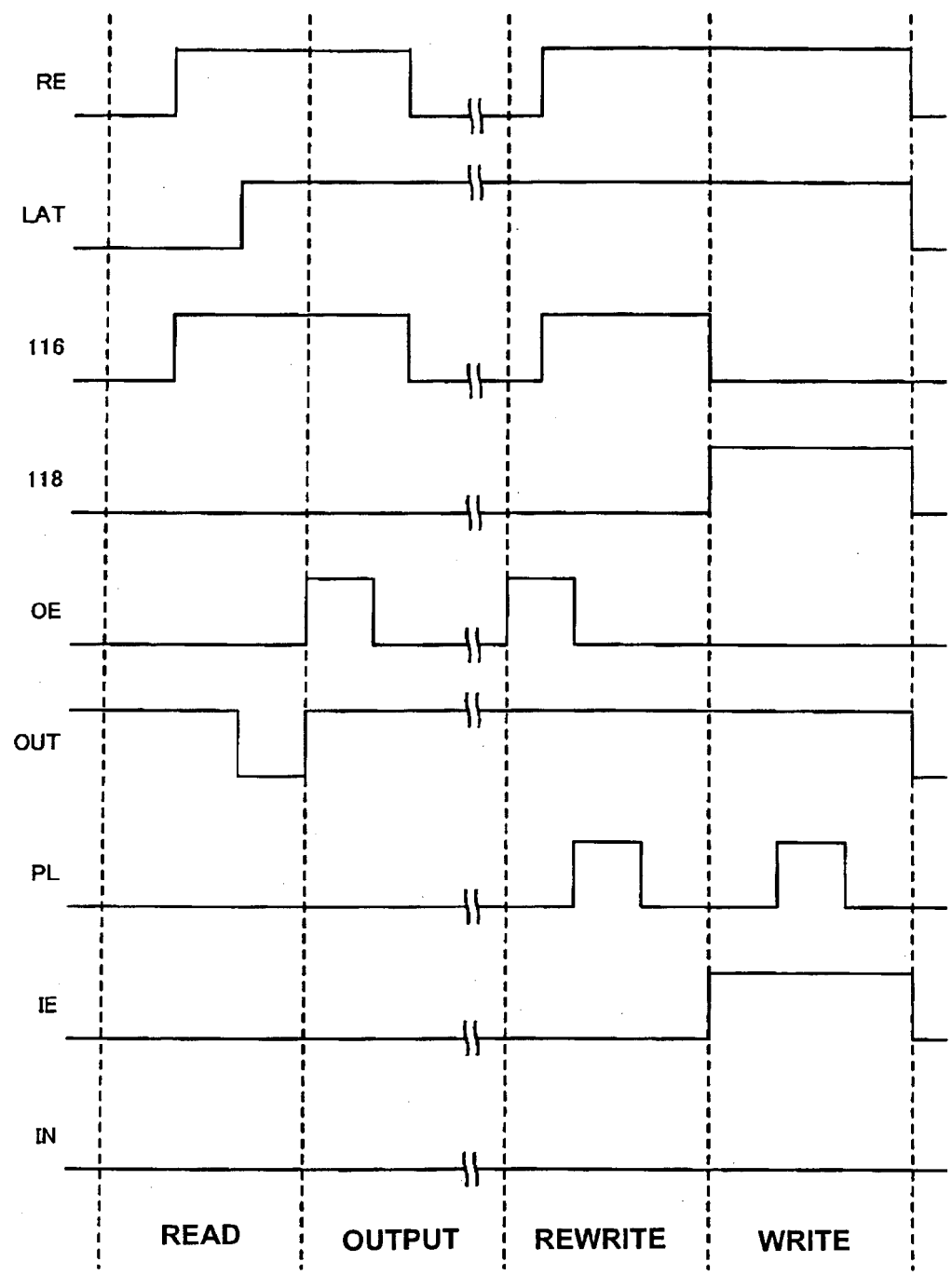
FIG. 3 is a timing chart indicating operations of the program circuit 100 in accordance with the first embodiment.

FIG. 3 is a timing chart indicating operations of the program circuit 100 in accordance with the first embodiment. In the present embodiment, each of the control signals is a digital signal indicating a logical H or a logical L. The potential of each control signal, when the control signal indicates a logical H, is generally at the same potential as that of the driving voltage VCC of the ferroelectric memory device 500. Also, the potential of each control signal, when the control signal indicates a logical L, is at a grounding potential, in other words, 0V.

Figure 4:
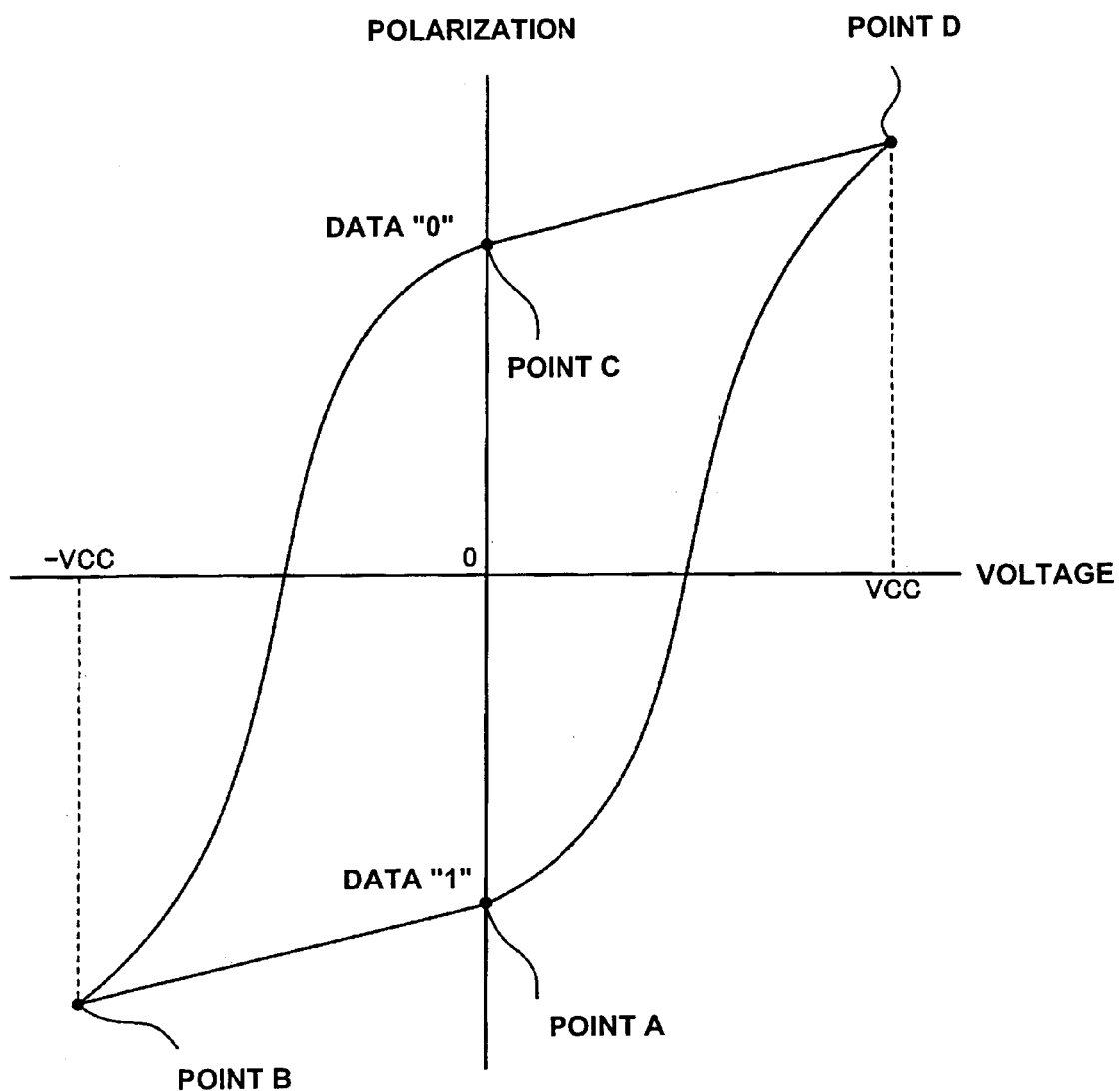
FIG. 4 is a diagram indicating hysteresis characteristics of a first ferroelectric capacitor 122 and a second ferroelectric capacitor 124.

FIG. 4 is a diagram indicating hysteresis characteristics of the first ferroelectric capacitor 122 and the second ferroelectric capacitor 124. In the figure, an axis of ordinates indicates polarizations of the first ferroelectric capacitor 122 and the second ferroelectric capacitor 124, and an axis of abscissas indicates voltages that are applied to the first ferroelectric capacitor 122 and the second ferroelectric capacitor 124. In the figure, when the potential on one ends of the first ferroelectric capacitor 122 and the second ferroelectric capacitor 124 is higher than the potential on the other ends thereof, voltages applied to the first ferroelectric capacitor 122 and the second ferroelectric capacitor 124 are expressed in the positive side.

Also, in the present embodiment, data "0" is written in the first ferroelectric capacitor 122, and data "1" is written in the second ferroelectric capacitor 124. In other words, the first ferroelectric capacitor 122 has a capacity C0 based on its paraelectric characteristic, and the second ferroelectric capacitor 124 has a capacity C1 that is greater than the capacity C0 as a capacity based on its paraelectric characteristic. Also, because the voltage that is applied to the first ferroelectric capacitor 122 and the second ferroelectric capacitor 124 is 0V in an initial state, their hysteresis characteristics are at point C and point A, respectively. Operations of the program circuit of the present embodiment are described below with reference to FIG. 2 through FIG. 4.

First, in an initial state, the control signal RE indicates a logical L. Accordingly, the driving voltage is not supplied to the flip-flop 110, such that the potential on the first terminal 116 and the second terminal 118 is 0V. Also, because the n-type MOS transistors 132 and 134 provided in the discharge section 130 become conductive, the potentials on one ends and the other ends of the first ferroelectric capacitor 122 and the second ferroelectric capacitor 124 are both generally 0V, in other words, generally the same potential.

Next, operations to read memory data stored in the storage section 120, and to latch the same at the latch circuit 180 are described. First, the control section 540 changes the control signal RE to a logical H. When the control signal RE changes to a logical H, the driving voltage VCC is supplied to the flip-flop 110. At this moment, because the potentials of inputs to the first inverter 112 and the second inverter 114 are 0V, the potentials of outputs from the first inverter 112 and the second inverter 114, in other words, the potentials on the first terminal 116 and the second terminal 118, rise, according to the rise of the power source voltage.

At this moment, a capacity C0 is appended to the first terminal 116 by the first ferroelectric capacitor 122, and a capacity C1 that is greater than the capacity C0 is appended to the second terminal 118 by the second ferroelectric capacitor 124. In other words, to raise the potentials on the first terminal 116 and the second terminal 118, the capacities C0 and C1 need to be charged, respectively. In the present embodiment, a greater capacity is appended to the second terminal 118 than to the first terminal, such that the potential on the first terminal 116 rises quicker than the potential on the second terminal 118 does. Accordingly, the potential on the first terminal 116 reaches a threshold voltage Vt of the first inverter 112 and the second inverter 114 earlier than the potential on the second terminal 118 does. It is noted here that the threshold voltage Vt of an inverter is a voltage at which the logical value of an output of the inverter changes.

When the potential on the first terminal 116 reaches the threshold voltage Vt, the output of the first inverter 112 changes to a logical L. Accordingly, when the potential on the first terminal 116 reaches the threshold voltage Vt, the potential on the second terminal 118 falls to 0V. Also, when the potential on the second terminal 118 falls to 0V, the output from the second inverter 114 would change to a logical H. Accordingly, when the potential on the first terminal 116 reaches the threshold voltage Vt, the potential on the first terminal 116 becomes to be generally the same potential of the power supply voltage. By this, the flip-flop 110 retains memory data in which the potential on the first terminal 116 is a logical H, and the logical value on the second terminal 118 is a logical L. By the operations described above, memory data stored in the storage section 120 is read out, and the memory data is retained on the flip-flop 110.

Next, the control section 560 changes the control signals LAT and OE to a logical H. When the control signal LAT changes to a logical H, the logical value on the input terminal 186 of the latch circuit 180 becomes to be a logical H, and the logical value on the output terminal 188 becomes to be logical L. Then, when the control signal OE changes to a logical H, the connection section 160 becomes conductive, such that the second terminal 118 of the flip-flop 110 and the input terminal 186 of the latch circuit 180 are electrically connected. By this, the potential on the input terminal 186 becomes to be generally the same potential as the potential on the second terminal 118, in other words, 0V. Then, when the potential on the input terminal 186 becomes to be 0V, the potential on the output terminal 188 becomes to be VCC. Accordingly, the latch circuit 180 latches memory data written in the flip-flop 110, based on the potential on the second terminal 118. In other words, the memory data written in the flip-flop 110 is transferred to the latch circuit 180. Then, the latch circuit 180 outputs VCC that is the potential on the output terminal 188 as an output signal OUT indicating the memory data written in the flip-flop 110, in other words, the memory data stored in the storage section 120.

Next, the control section 540 changes the control signal RE to a logical L. By this, supply of the driving voltage to the flip-flop 110 is stopped, such that the potentials on the first terminal 116 and the second terminal 118 become to be generally 0V. Also, when the control signal RE changes to a logical L, the voltages on the both ends of the first ferroelectric capacitor 122 and the second ferroelectric capacitor 124 become to be generally the same potentials as those on the first terminal 116 and the second terminal 118, respectively, namely, generally 0V. In other words, the voltage applied to the first ferroelectric capacitor 122 and the second ferroelectric capacitor 124 becomes to be generally 0V, such that the first ferroelectric capacitor 122 and the second ferroelectric capacitor 124 are discharged.

Next, re-writing operations to store memory data latched at the latch circuit 180 in the storage section 120 again are described. First, memory data latched at the latch circuit 180 is written in the flip-flop 110. More specifically, first, the control section 540 changes the control signal OE to a logical H, thereby bringing the potential on the second terminal 118 to be generally the same potential as the potential on the input terminal 186. In the present embodiment, because the potential on the input terminal 186 is generally 0V, the potential on the second terminal 118 remains to be generally 0V.

Next, the control section 540 changes the control signal RE to a logical H. When the control signal RE changes to a logical H, the first inverter 112 outputs a logical H, because the second terminal 118 remains to be electrically connected to the input terminal 186, and its potential is generally 0V. In other words, the potential on the first terminal 116 becomes to be VCC. Accordingly, the flip-flop 110 retains memory data in which the first terminal 116 is at a logical H, and the second terminal 118 is at a logical L. In other words, the memory data written in the latch circuit 180 from the flip-flop 110 is rewritten in the flip-flop 110.

Next, the memory data rewritten in the flip-flop 110 is stored in the storage section 120 again. When the memory data is rewritten in the flip-flop 110, the potential on one end of the first ferroelectric capacitor 122 becomes to be VCC, and the potential on one end of the second ferroelectric capacitor 124 becomes to be 0V. At this moment, the logical value of the control signal PL is a logical L. In other words, because the potential on the other end of the first ferroelectric capacitor 122 is 0V, the voltage applied to the first ferroelectric capacitor 122 becomes to be VCC. Accordingly, referring to FIG. 4, because the hysteresis characteristic of the first ferroelectric capacitor 122 moves to point D, data "0" is rewritten in the first ferroelectric capacitor 122.

Next, the control section 540 changes the control signal PL to a logical H, in other words, changes the potential on the other ends of the first ferroelectric capacitor 122 and the second ferroelectric capacitor 124 to VCC. At this moment, because the potential on one end of the second ferroelectric capacitor 124 is 0V, the voltage applied to the second ferroelectric capacitor 124 becomes to be −VCC. Accordingly, referring to FIG. 4, because the hysteresis characteristic of the second ferroelectric capacitor 124 moves to point B, data "1" is rewritten in the second ferroelectric capacitor 124. On the other hand, because the voltage applied to the first ferroelectric capacitor 122 is generally 0V, its hysteresis characteristic moves to point C. Accordingly, the data "0" rewritten in the first ferroelectric capacitor 122 is kept retained as it is. By the operations described above, the memory data, which is the same data retained at the flip-flop 110, is stored in the memory section 120 again.

Writing operations to store desired memory data in the storage section 120 are described. In the example below, operations to store memory data, which is different from the memory data that was stored in the storage section, in the storage section 120 are described. In other words, operations to write data "1" in the first ferroelectric capacitor 122, and data "0" in the second ferroelectric capacitor 124, are described.

First, in a state in which the flip-flop 110 is electrically cut off from the latch circuit 180, the control section 540 changes the control signal IE to a logical H, such that the n-type MOS transistor composing the writing section 150 becomes conductive. Then, the control section 540 brings the potential of the control signal IN to 0V, to thereby bring the potential on the first terminal 116 to 0V. By this, because the first inverter 112 outputs a logical H, the potential on the second terminal 118 becomes to be VCC, and the output of the second inverter 114 becomes to be a logical L.

At this moment, because the logical value of the control signal PS is a logical L, in other words, the potential on the other end of the second ferroelectric capacitor 124 is 0V, the voltage applied to the second ferroelectric capacitor 124 becomes to be VCC. Accordingly, referring to FIG. 4, because the hysteresis characteristic of the second ferroelectric capacitor 124 moves to point D, data "0" is written anew in the second ferroelectric capacitor 124.

Next, the control section 540 changes to the control signal PL to a logical H, in other words, changes the potential on the other ends of the first ferroelectric capacitor 122 and the second ferroelectric capacitor 124 to VCC. At this moment, because the potential on one end of the first ferroelectric capacitor 122 is 0V, the voltage applied to the first ferroelectric capacitor 122 becomes to be −VCC. Accordingly, referring to FIG. 4, because the hysteresis characteristic of the first ferroelectric capacitor 122 moves to point B, data "1" is written anew in the first ferroelectric capacitor 122. On the other hand, because the voltage applied to the second ferroelectric capacitor 124 is generally 0V, its hysteresis characteristic moves to point C. Accordingly, the data "0" written in the second ferroelectric capacitor 124 is kept retained as it is. By the operations described above, memory data, which is different from the memory data retained at the flip-flop 110, is stored anew in the storage section 120.

Figure 5:
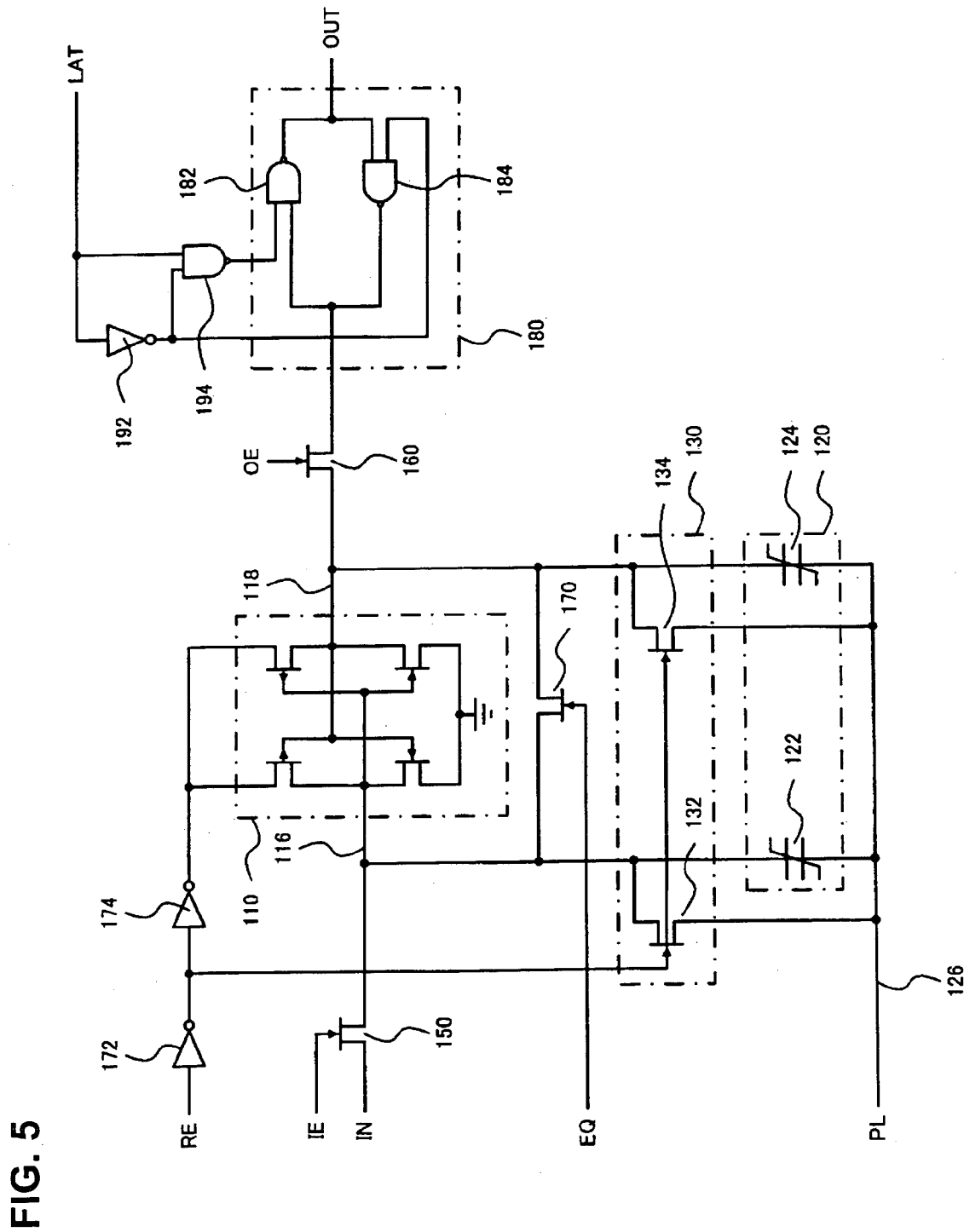
FIG. 5 is a diagram indicating a program circuit 100 in accordance with a second embodiment.

FIG. 5 is a diagram indicating a program circuit in accordance with a second embodiment. The program circuit 100 in accordance with the second embodiment is described below, focusing on features different from those of the first embodiment. It is noted that components appended with the same reference numbers as those of the first embodiment have functions similar to those of the first embodiment. Also, the control section 540 controls the program circuit 100 of the present embodiment in a similar manner as the second embodiment. In other words, the control section 540 controls each of the control signals at timings similar to those of the second embodiment.

The program circuit 100 in accordance with the second embodiment is further provided with a short-circuit section 170 in addition to the structure of the first embodiment. The short-circuit section 170 short-circuits the first terminal 116 and the second terminal 118. In other words, the short-circuit section 170 brings the potential on the first terminal 116 and the potential on the second terminal 118 to generally the same potential.

The short-circuit section 170 of the present embodiment has a structure having an n-type MOS transistor. More specifically, the n-type MOS transistor has one of its source and drain being electrically connected to the first terminal 116, and the other being electrically connected to the second terminal 118. Then, the n-type MOS transistor controls, based on the potential of the control signal EQ supplied to its gate, as to whether or not the first terminal 116 and the second terminal 118 are to be short-circuited. When the control signal RE changes to a logical H, the error operation of flip-flop by noise, etc. is prevented, because the potential on the first terminal 116 and the potential on the second terminal 118 are generally the same potential by short-circuit the short-circuit section 170.

Figure 6:
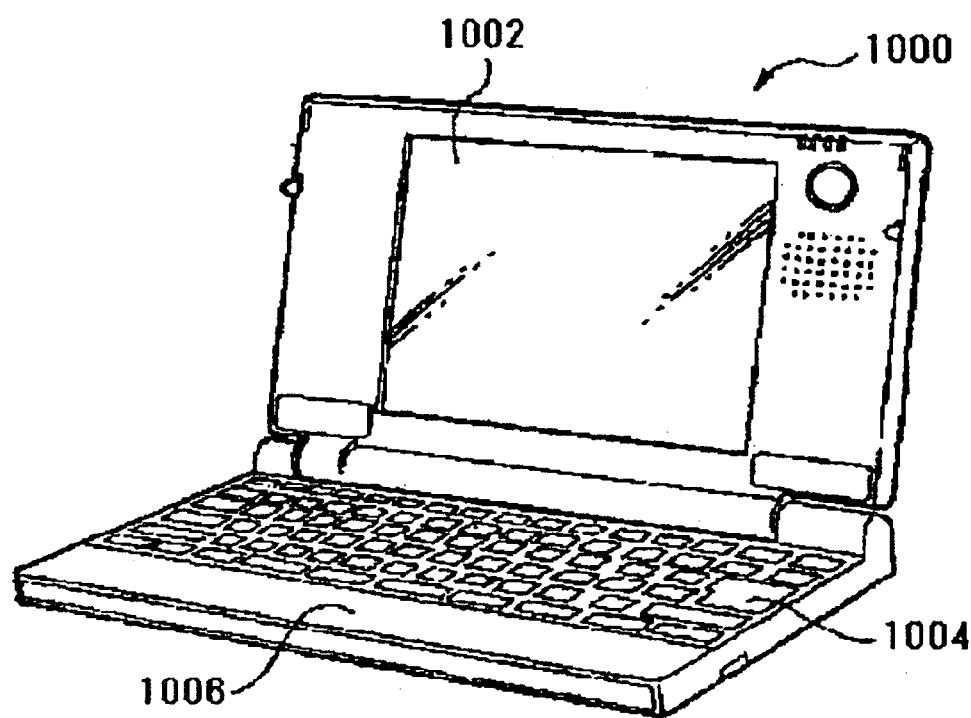
FIG. 6 is a perspective view showing a structure of a personal computer 1000, which is an example of an electronic apparatus in accordance with an embodiment of the present invention.

FIG. 6 is a perspective view showing a structure of a personal computer 1000, which is an example of an electronic apparatus in accordance with an embodiment of the present invention. In FIG. 6, the personal computer 1000 has a structure equipped with a display panel 1002 and a main body 1006 having a keyboard 1004. As storage medium, and in particular, a nonvolatile memory of the main body 1006 of the personal computer 1000, a semiconductor device equipped with a storage circuit in accordance with the present invention is used.

The embodiment examples and application examples described above with reference to the embodiments of the present invention may be appropriately combined depending on the usages, or may be used with changes and/or improvements added thereto. The present invention is not limited to the descriptions of the embodiments above. It is clear from the description in the scope of patent claims that modes created by such combinations, changes and/or improvements can be included in the technical scope of the present invention.

What is claimed is:

1. A storage circuit characterized in comprising:
a flip-flop having a first terminal and a second terminal;
a storage section having a first ferroelectric capacitor and a second ferroelectric capacitor for storing specified data;
a discharge section that brings both ends of the first ferroelectric capacitor and the second ferroelectric capacitor to generally an identical potential
a control section that supplies a driving voltage to the flip-flop, and controls potentials on the first terminal and the second terminal based on the specified data, thereby retaining the specified data at the flip-flop; and
a latch circuit that latches the specified data retained by the flip-flop based on potentials on the first terminal and the second terminal.

2. A storage circuit according to claim 1, characterized in that:
the first ferroelectric capacitor gives a first capacity to the first terminal, and the second ferroelectric capacitor gives a second capacity different from the first capacity to the second terminal, and
the flip-flop retains the specified data based on the first capacity and the second capacity.

3. A storage circuit according to claim 1, characterized in that the control section stops supplying the driving voltage to the flip-flop after the latch circuit has latched the specified data.

4. A storage circuit according to claim 1, characterized in that the discharge section controls, based on a timing at which the control section starts or stops supplying the driving voltage to the flip-flop, as to whether or not the both ends of the first ferroelectric capacitor and the second ferroelectric capacitor are to be brought to generally an identical potential.

5. A storage circuit according to claim 1, characterized in that the control section re-supplies the driving voltage to the flip-flop, thereby re-retaining the specified data retained by the latch circuit in the flip-flop.

6. A storage circuit according to claim 1, characterized in further comprising a switch that controls as to whether or not the first terminal or the second terminal is electrically connected to the latch circuit.

7. A storage circuit according to claim 6, characterized in that
the flip-flop retains the specified data by placing the second terminal to a first potential or a second potential higher than the first potential, and
the latch circuit has an input terminal that is electrically connected to the switch, wherein, when the switch electrically connects the flip-flop and the input terminal, a potential on the input terminal becomes to be generally an identical potential as the second potential.

8. A storage circuit according to claim 1, characterized in further comprising a short-circuit section that controls as to whether or not the first terminal and the second terminal are to be electrically connected.

9. A storage circuit according to claim 1, characterized in that complementary data are written in the first ferroelectric capacitor and the second ferroelectric capacitor.

10. A semiconductor device characterized in comprising a storage circuit recited in claim 1.

11. An electronic apparatus characterized in comprising a semiconductor device recited in claim 10.

* * * * *